United States Patent
Wang et al.

(10) Patent No.: US 7,474,245 B1
(45) Date of Patent: Jan. 6, 2009

(54) DIGITAL-TO-ANALOG CONVERTER

(75) Inventors: Hui-Min Wang, Tainan County (TW);
Chen-Song Yen, Tainan County (TW);
Chin-Tien Chang, Tainan County (TW);
Chuan-Che Lee, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 11/898,538

(22) Filed: Sep. 13, 2007

(51) Int. Cl.
*H03M 1/68* (2006.01)

(52) U.S. Cl. .................................... 341/145
(58) Field of Classification Search ................ 341/145
See application file for complete search history.

(56) References Cited

U.S. PATENT DOCUMENTS 3,997,892 A * 12/1976 Susset .................... 341/145
5,554,986 A * 9/1996 Neidorff .................. 341/145
6,268,817 B1 * 7/2001 Min et al. ................ 341/145
6,958,720 B1 * 10/2005 Prater ...................... 341/145

* cited by examiner

*Primary Examiner*—Howard Williams
(74) *Attorney, Agent, or Firm*—Rabin & Berdo, P.C.

(57) ABSTRACT

A digital-to-analog converter outputting an output analog voltage according to an N-bit digital signal is provided. The digital-to-analog converter includes a first and a second resistor strings, a first and a second select units. The first resistor string is connected between a first and a second power supply voltages to generate a first group of reference voltages. The first select unit selects two reference voltages out of the first group according to M most significant bits of the N-bit digital signal. The second resistor string is connected between the selected reference voltages to generate a second group of reference voltages between the selected reference voltages. The second select unit selects one reference voltage out of the second group as the output analog voltage according to the N-M least significant bits of the N-bit digital signal.

4 Claims, 2 Drawing Sheets

DIGITAL-TO-ANALOG CONVERTER

BACKGROUND OF THE INVENTION

1. Field of the Invention

The invention relates in general to a digital-to-analog converter, and more particularly to a digital-to-analog converter capable of saving the circuit area.

2. Description of the Related Art

FIG. 1 shows a conventional digital-to-analog converter (DAC). The digital-to-analog converter is for converting a digital signal into an output analog voltage. In FIG. 1, the conventional digital-to-analog converter 100 includes a resistor string 110, which contains a number of resistors serially connected, and a select unit 120. The resistor string 120 generates a group of reference voltages between a high reference voltage and a low reference voltage. The select unit 120 then selects one reference voltage out of the group of the reference voltage as the output analog voltage Vo according to the digital signal Sd. However, when the digital signal Sd is increased by N bits, the amount of the resistors in the resistor string 110 grows $2^N$ times accordingly in order to generate sufficiently fine output analog voltage. For example, when the digital signal is increased only by one bit, the amount of the resistors has to be doubled. Therefore, the more bit the digital signal has, the much greater amount of resistors are needed. Consequently not only the circuit area, but also the cost of the conventional DAC grows significantly.

SUMMARY OF THE INVENTION

The invention is directed to a digital-to-analog converter (DAC). The digital-to-analog converter uses a first resistor string and a second resistor string to convert a digital signal. The DAC can effectively reduce the number of resistors needed, and therefore the circuit area and the cost for the DAC is cut significantly.

According to (a first aspect on the present invention, a digital-to-analog converter outputting an output analog voltage according to an N-bit digital signal is provided. The digital-to-analog converter includes a first resistor string, a second resistor string, a first select unit, and a second select unit. The first resistor string is connected between a first and a second power supply voltages to generate a first group of reference voltages between the first and second power supply voltages. The first select unit selects two reference voltages out of the first group according to M most significant bits of the N-bit digital signal. The second resistor string is connected between the selected reference voltages to generate a second group of reference voltages between the selected reference voltages. The second select unit selects one reference voltage out of the second group as the output analog voltage according to the N-M least significant bits of the N-bit digital signal.

The invention will become apparent from the following detailed description of the preferred but non-limiting embodiments. The following description is made with reference to the accompanying drawings.

DETAILED DESCRIPTION OF THE INVENTION

Figure 1:
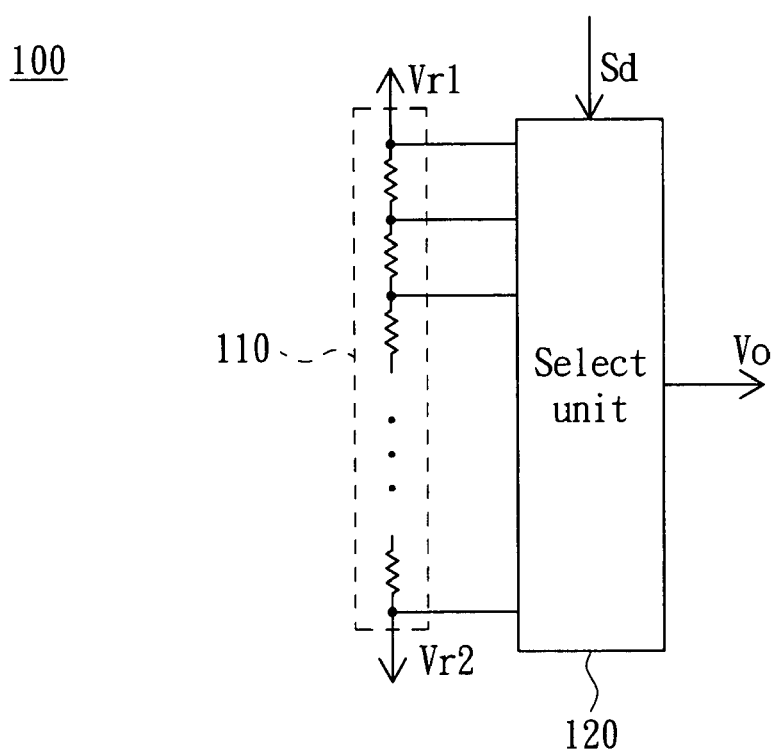
FIG. 1 shows a conventional digital-to-analog converter (DAC).
Figure 2:
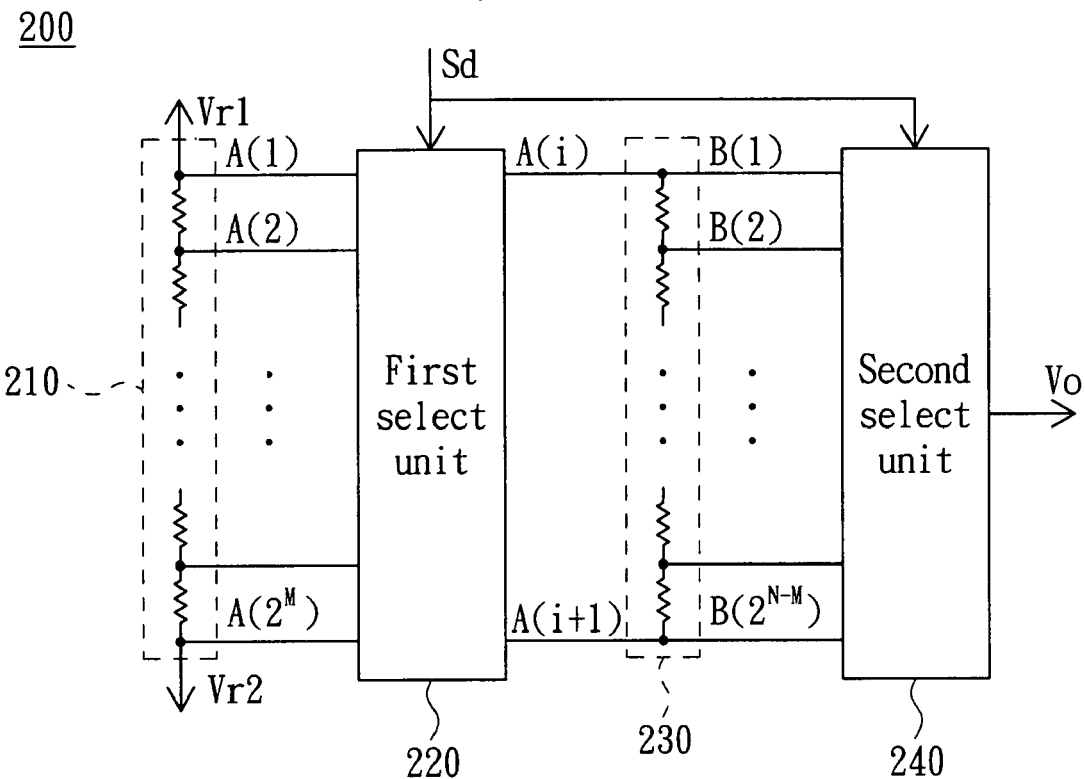
FIG. 2 shows the circuit diagram of the digital-to-analog converter of the embodiment of the present invention.

FIG. 2 illustrates the circuit diagram of the digital-to-analog converter (DAC) 200 of the embodiment of the present invention. The digital-to-analog converter 200 is for outputting an output analog voltage Vo according to an N-bit digital signal Sd. The DAC 200 includes a first resistor string 210, a first select unit 220, a second resistor string 230, and a second select unit 240. The number N is an integer.

The first resistor string 210 is connected between power supply voltages Vr1 and Vr2 to generate a first group of reference voltages A(1) to A($2^M$) between the power supply voltages Vr1 and Vr2. In the embodiment of the present invention, the first resistor string 210 includes $2^M$ resistors serially connected together. The first group of reference voltages A(1) to A($2^M$) are voltages at the nodes between the $2^M$ resistors. The number M is an integer smaller than N.

The first select unit 220 selects two reference voltages, for example, A(i) and A(i+1), out of the first group A(1) to A($2^M$) according to M most significant bits of the N-bit digital signal Sd. The number i is an integer smaller than $2^M-1$.

The second resistor string 230 is connected between the selected reference voltages A(i) and A(i+1) to generate a second group of reference voltages B(1) to B($2^{N-M}$) between the selected reference voltages A(i) and A(i+1). In the embodiment of the present invention, the second resistor string 230 includes $2^{N-M}$ resistors serially connected together. The second group of the reference voltages B(1) to B($2^{N-M}$) are voltages at nodes between the $2^{N-M}$ resistors.

The second select unit 240 selects one reference voltage out of the second group B(1) to B($2^{N-M}$) as the output analog voltage Vo according to the N-M least significant bits of the N-bit digital signal Sd.

In the embodiment of the present invention, the first resistor string, which contains $2^M$ resistors, and the second resistor string, which contains $2^{N-M}$ resistors are used in the DAC 200 for converting N-bit digital signal Sd. In comparison, $2^N$ resistors are necessary for converting the same N-bit digital signal Sd in the conventional DAC. Thus, the number of the resistors needed in the DAC of the embodiment of the present invention is much less than the number of the resistors needed in the conventional DAC for converting the same digital signal.

For the digital signal having more bits, for example, N+1 bits, the number of the resistor would be double for enabling to convert the N+1-bit digital signal. However, in the DAC of the embodiment of the present invention, only the number of the resistor in either the first resistor string or the second resistor string have to be doubled for converting the same N+1-bit digital signal.

For example, $2^{10}$ (1024) resistors are needed in the conventional for converting a 10-bit digital signal. However, in the embodiment of the present invention, for converting the 10-bit digital signal, the first resistor string includes, for example, $2^6$ resistors while the second resistor string includes $2^4$ resistors. Hence, only $2^6+2^4$ (80) resistors are needed in the present invention. The number of resistors used in the DAC of the embodiment of the present invention reduces considerably.

The number of the resistors needed in the DAC of the embodiment of the present invention shrinks significantly when the digital signal has more bits. For example, for converting a 12-bit digital signal, the first resistor string may be designed to include $2^6$ (64) resistors, while the second resistor string is designed to contain $2^6$ (64) resistors. Thus, the DAC of the embodiment of the present invention need only 128 resistors, while the conventional DAC need $2^{12}$ (4096) resistors for converting the 12-bit digital signal. Therefore, the circuit area and the cost of the DAC of the present invention can be reduced very largely.

Figure 3:
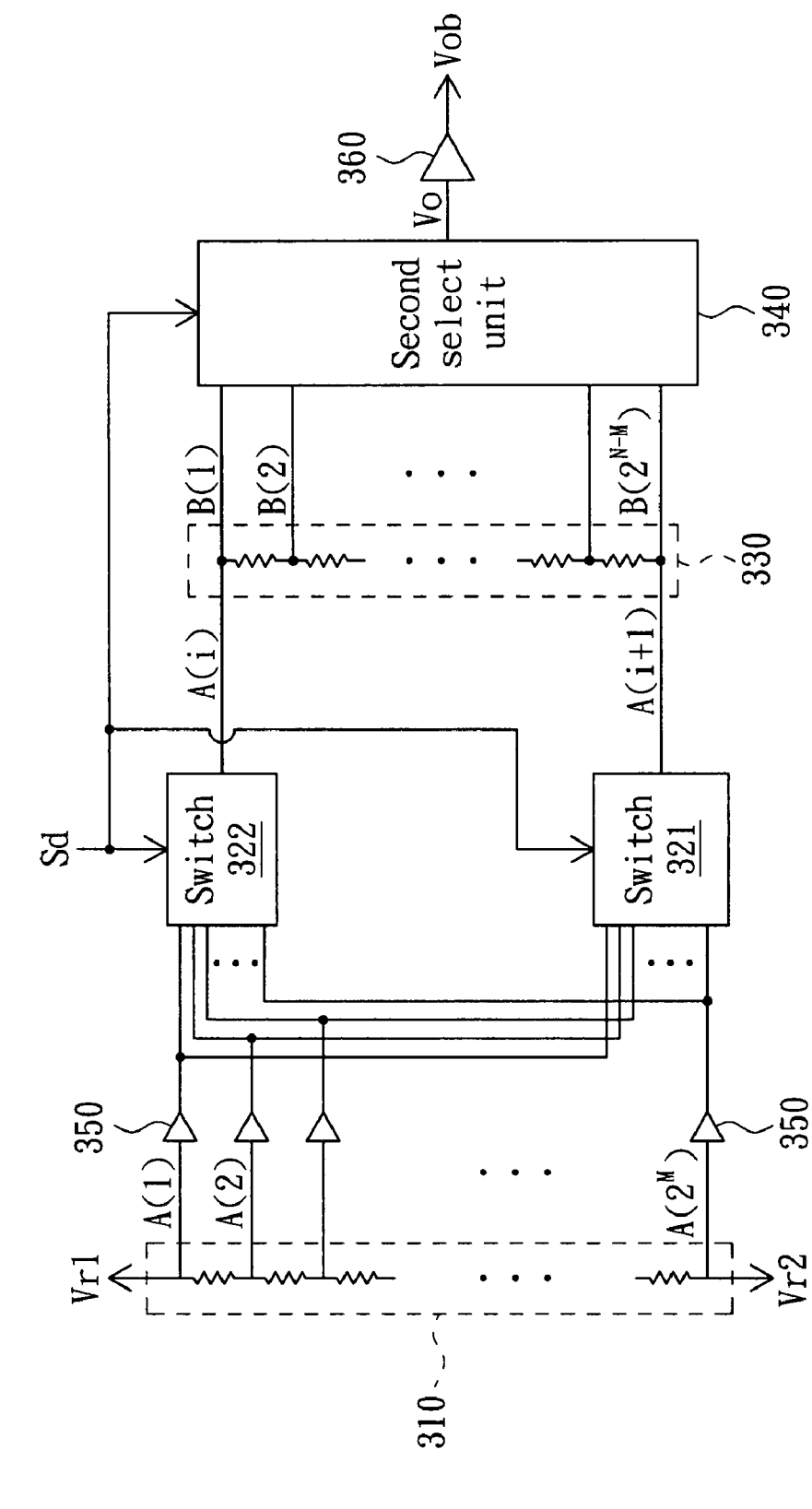
FIG. 3 shows a digital-to-analog converter of another embodiment of the present invention.

FIG. 3 shows a digital-to-analog converter 300 of another embodiment of the present invention. The DAC 300 is for converting the N-bit digital signal Sd into an analog signal Vo. The DAC 300 includes a first resistor string 310, switches 321 and 322, a second resistor string 330, a second select unit 340, a number of buffer amplifiers 350, a output buffer 360. In the embodiment of the present invention, the first resistor string 310 includes $2^M$ resistors while the second resistor string 330 includes $2^{N-M}$ resistors.

Similarly, the first resistor string 310 connected between power supply voltages Vr1 and Vr2 to generate a first group of reference voltages A(1) to A($2^M$) between the power supply voltages Vr1 and Vr2. The first group of reference voltages A(1) to A($2^M$) are voltages at the nodes between the $2^M$ resistors. Reference voltages A(1) to A($2^M$) are buffered respectively by buffer amplifiers 350 and then outputted to switches 321 and 322. P The switches 321 and 322 both receive the N-bit digital signal Sd, and respectively select one reference voltages A(i) and A(i+1), out of the first group A(1) to A($2^M$) according to M most significant bits of the N-bit digital signal Sd.

The second resistor string 330 connected between the selected reference voltages A(i) and A(i+1) to generate a second group of reference voltages B(1) to B($2^{N-M}$) between the selected reference voltages A(i) and A(i+1). The second group of the reference voltages B(1) to B($2^{N-M}$) are voltages at nodes between the $2^{N-M}$ resistors.

The second select unit 340, for example, a switch, selects one reference voltage out of the second group B(1) to B($2^{N-M}$) as the output analog voltage Vo according to the N-M least significant bits of the N-bit digital signal Sd. The output buffer 360 buffers the output analog voltage Vo and outputs a buffered output analog voltage Vob accordingly.

The DAC of the embodiment of the present invention needs less resistors, comparing to the conventional DAC, for converting a digital signal into an output analog voltage. Therefore, the circuit area and the cost of the DAC reduce significantly.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A digital-to-analog converter outputting an output analog voltage according to an N-bit digital signal, the digital-to-analog converter comprising:
    a first resistor string connected between a first and a second power supply voltages to generate a first group of reference voltages between the first and second power supply voltages;
    a first select unit selecting two reference voltages out of the first group according to M most significant bits of the N-bit digital signal;
    a plurality of buffer amplifiers configured to receive the first group of reference voltages and output said first group to the first select unit;
    a second resistor string connected between the selected reference voltages to generate a second group of reference voltages between the selected reference voltages; and
    a second select unit selecting one reference voltage out of the second group as the output analog voltage according to the N-M least significant bits of the N-bit digital signal.

2. The digital-to-analog converter according to claim 1, wherein the first select unit comprises two switches for receiving the first group of reference voltages and selecting the two reference voltages according to the M most significant bits of the N-bit digital signal.

3. The digital-to-analog converter according to claim 1, further comprising an output buffer for receiving the output analog voltage and outputting a buffered output analog voltage.

4. The digital-to-analog converter according to claim 1, wherein the second select unit is a switch.

* * * * *